(12) United States Patent
Lin et al.

(10) Patent No.: US 8,969,124 B2
(45) Date of Patent: Mar. 3, 2015

(54) METHOD FOR FABRICATING CU—IN—GA—SE FILM SOLAR CELL

(71) Applicants: Liuyu Lin, New Taipei (CN); Zhun Zhang, New Taipei (CN)

(72) Inventors: Liuyu Lin, New Taipei (CN); Zhun Zhang, New Taipei (CN)

(*) Notice: Subject to any disclaimer, the term of this patent is extended or adjusted under 35 U.S.C. 154(b) by 0 days.

(21) Appl. No.: 14/153,026

(22) Filed: Jan. 11, 2014

(65) Prior Publication Data

US 2015/0017755 A1 Jan. 15, 2015

Related U.S. Application Data

(63) Continuation of application No. PCT/CN2013/074072, filed on Apr. 11, 2013.

(30) Foreign Application Priority Data

Jun. 11, 2012 (CN) .......................... 2012 1 0192751

(51) Int. Cl.
*H01L 21/00* (2006.01)
*H01L 31/18* (2006.01)
*H01L 31/0336* (2006.01)

(52) U.S. Cl.
CPC ........ *H01L 31/1864* (2013.01); *H01L 31/0336* (2013.01)
USPC ............................................. 438/95; 438/87

(58) Field of Classification Search
USPC .................................................... 438/87, 95
See application file for complete search history.

(56) References Cited

U.S. PATENT DOCUMENTS

| 8,894,826 B2* | 11/2014 | Frantz et al. ............. 204/192.26 |
| 2010/0059385 A1* | 3/2010 | Li ................................... 205/84 |
| 2012/0132281 A1* | 5/2012 | Yang et al. ..................... 136/260 |
| 2013/0164885 A1* | 6/2013 | Liang et al. ...................... 438/95 |
| 2013/0230933 A1* | 9/2013 | Li ..................................... 438/14 |
| 2013/0309850 A1* | 11/2013 | Liang et al. ................... 438/509 |
| 2014/0113403 A1* | 4/2014 | Van Duren et al. ............. 438/95 |
| 2014/0193943 A1* | 7/2014 | Lin et al. ......................... 438/95 |

FOREIGN PATENT DOCUMENTS

| CN | 101728461 A | 6/2010 |
| CN | 101814553 A | 8/2010 |
| CN | 102054897 A | 5/2011 |
| CN | 102290339 A | 12/2011 |
| CN | 102694077 A | 9/2012 |

* cited by examiner

*Primary Examiner* — Alexander Ghyka

(57) ABSTRACT

A method for fabricating a Cu—In—Ga—Se film solar cell is provided. The method comprises: a) fabricating a molybdenum back electrode on a substrate; b) fabricating a Cu—In—Ga—Se absorbing layer on the molybdenum back electrode; c) performing an annealing; d) fabricating an In2Se3 or ZnS buffer layer on the Cu—In—Ga—Se absorbing layer; e) fabricating an intrinsic zinc oxide high impedance layer; f) fabricating an indium tin oxide film low impedance layer on the intrinsic zinc oxide high impedance layer; g) fabricating an aluminum electrode on the indium tin oxide film low impedance layer.

6 Claims, 2 Drawing Sheets

METHOD FOR FABRICATING CU—IN—GA—SE FILM SOLAR CELL

CROSS-REFERENCE TO RELATED APPLICATIONS

This application is a continuation of International Application No. PCT/CN2013/074072, filed on Apr. 11, 2013, which claims priority to Chinese Patent Application No. 201210192751.9, filed on Jun. 11, 2012, both of which are hereby incorporated by reference in their entireties.

TECHNICAL FIELD

The present disclosure relates to solar cell field, and more particularly to a method for fabricating an absorbing layer of a Cu—In—Ga—Se film solar cell.

BACKGROUND

Currently, in one aspect, the available energy on the earth is increasingly decreasing, in another aspect, a petrifaction fuel may generate an emission of carbon oxide and sulfur oxide to pollute the air and increase a greenhouse effect, thus leading to a worse global environment and an unusual climate. Therefore, a development of pollution-free, renewable energy sources has become a primary research subject. A pollution-free solar energy is one of the best options of renewable energy. A primary task of a development of the solar cell lies in a development of a material for converting the solar energy into an electric energy with high efficiency.

It is well known that a Cu—In—Ga—Se compound which has a chalcopyrite structure may be fabricated on a soft or rigid substrate as a material for solar energy generation. Such Cu—In—Ga—Se film solar cell has advantages of high stability and low cost. The Cu—In—Ga—Se compound which is a compound semiconductor with chalcopyrite structure is a direct bandgap material, which can absorb solar lights in a wide wave length range and has a characteristic of forming a p-n junction by self-adjusting its component. Thus, the Cu—In—Ga—Se compound is considered as one of the best materials of an absorbing layer of the solar cell. For example, $Cu(InGa)Se_2$ (referred to as CIGS) is a semiconductor material with a best light-absorbing capability up to now. A thickness of a CIGS absorbing layer is only 1-2 μm because of the high light-absorbing capability of CIGS. For a mass production, a power generation cost of CIGS is only 0.03 USD/Watt according to a rough estimation, and thus, it is of a competitive edge. It is hopeful that a cost of the solar energy generation is equal to or even lower than that of the conventional petrifaction fuel power generation. Therefore, how to fabricate the Cu—In—Ga—Se film solar cell with low cost and high efficiency has become a research focus.

A CIGS film solar cell has following two advantages: (1) A photoelectricity conversion layer is as thin as a few micrometers; (2) A bandgap (forbidden bands) of Cu—In—Ga—Se compound may be adjusted by adjusting a content of Ga (gallium). According to a prior art, a relationship between a ratio of Ga to In and the bandgap (Eg) satisfies: Eg (eV) =$1.02+0.67 y+0.11 y(y-1)$, where $y=In/(Ga+In)$, which represents an atom content ratio. According to a theory, the solar energy is not maximally used by a solar cell with a single bandgap, that is, photon with low energy cannot generate any electron-hole pair, while photon with high energy can only excite one electron-hole pair, and the redundant energy is converted into thermal energy unfavorable for the efficiency of the solar cell. To this end, it is desired for the solar cell to have more bandgaps to absorb more solar energy, thus improving the efficiency of the solar cell, which may be just achieved by CIGS with the characteristic of adjustable bandgap. The content of Ga may be adjusted when fabricating the CIGS film. The bandgap of the CIGS compound rises with an increase of the proportion of Ga.

Conventional methods for fabricating the CIGS film mainly comprise: (1) a selenylation method; (2) a laminating method; (3) a multi-source (such as two-source or three-source) evaporation method; (4) a sputtering method; (5) a deposition method; (6) a spray coating method; (7) a spinning coating method; (8) a vacuum heating synthesis method, etc. For the selenylation method, the laminating method, the multi-source evaporation method and the sputtering method, a sulfurization or selenylation process is required in certain step to treat the CIGS film. Sulfur atoms and selenium atoms may react with Cu—In—Ga through diffusion so as to generate a CuInGaSe compound. This process is called as sulfurization or selenylation.

The selenylation method for fabricating the film solar cell with the chalcopyrite structure has following disadvantages of a long production period, a high energy consumption, a high consumption of selenium, a toxicity of a selenium vapor, a nonuniform distribution of selenium and a gradient distribution of selenium, etc.

In addition, it is difficult for the above methods to realize an adjustment of a gradient distribution of Ga by one-step. Taking a three-step co-evaporation method developed by an NREL Lab in United States for example, an A-shaped bandgap or a V-shaped bandgap is formed by different elements participation in three steps. The process is very complicated, and a precise real time control is also required. Although the film solar cell with a high conversion efficiency may be fabricated by this method, the method is not favorable for a mass production with a low cost and big area.

SUMMARY

In an aspect, a method for fabricating a Cu—In—Ga—Se film solar cell is provided. The method comprises:

a) fabricating a molybdenum back electrode on a substrate;

b) fabricating a Cu—In—Ga—Se absorbing layer on the molybdenum back electrode by a vacuum magnetron sputtering with $CuIn_xGa_{1-x}Se_2$ alloy targets, wherein supposing the $CuGaSe_2$ alloy target where x=0 is a target 1, and the $CuIn_xGa_{1-x}Se_2$ alloy target where x ranges from 0.6 to 0.8 is a target 2, firstly a sputtering with a high power density ranging from 4 $W/cm^2$ to 8 $W/cm^2$ is performed by the target 1 for 2-4 minutes, then a co-sputtering is performed with the target 1 and the target 2 for 30-60 minutes, in which the target 1 works with a power density continuously decreasing from any high power density ranging from 4 $W/cm^2$ to 8 $W/cm^2$ to any low power density ranging from 0.3 $W/cm^2$ to 1 $W/cm^2$, and the target 2 works with a power density continuously increasing from any initial low power density ranging from 0.3 $W/cm^2$ to 1 $W/cm^2$ to any high power density ranging from 4 $W/cm^2$ to 8 $W/cm^2$, so that a Ga concentration in the Cu—In—Ga—Se absorbing layer forms a gradient, the Ga concentration has a maximum on a surface of the Cu—In—Ga—Se absorbing layer contacting with the molybdenum back electrode and has a minimum on the other surface of the Cu—In—Ga—Se absorbing layer;

c) performing an annealing for the Cu—In—Ga—Se absorbing layer in a rapid heating mode in a vacuum chamber under a temperature of 400-600° C. for 55-90 seconds;

d) fabricating an $In_2Se_3$ or ZnS buffer layer with a thickness of 80-120 nm on the Cu—In—Ga—Se absorbing layer;

e) fabricating an intrinsic zinc oxide high impedance layer with a thickness of 0.1-0.5 μm on the $In_2Se_3$ or ZnS buffer layer;

f) fabricating an indium tin oxide film low impedance layer with a thickness of 0.3-0.8 μm on the intrinsic zinc oxide high impedance layer;

g) fabricating an aluminum electrode on the indium tin oxide film low impedance layer.

In one embodiment, a thickness of the Cu—In—Ga—Se absorbing layer ranges from 1.5 μm to 2 μm.

In one embodiment, in step b), a working pressure of a sputtering chamber is $1\times10^{-4}$ Torr, and a temperature of the substrate is maintained at any temperature between 350° C. and 450° C.

In one embodiment, in step d), the $In_2Se_3$ or ZnS buffer layer is fabricated by a vacuum magnetron sputtering with an $In_2Se_3$ alloy target or a ZnS alloy target under a working pressure of $1\text{-}5\times10^{-3}$ Torr in an Ar ambience, and a temperature of the substrate is maintained at a room temperature.

In one embodiment, in step e), the intrinsic zinc oxide high impedance layer is fabricated by a radio frequency vacuum magnetron sputtering with an intrinsic zinc oxide target under a working pressure of $1\text{-}5\times10^{-3}$ Torr with a working frequency of 400K-2 MHz in an Ar ambience, and a temperature of the substrate is maintained at a room temperature.

In one embodiment, in step f), the indium tin oxide film low impedance layer is fabricated by a vacuum direct current magnetron sputtering with an indium tin oxide target, in which a mass ratio of $In_2O_3$ to $SnO_2$ is 9:1, under a working pressure of $1\text{-}5\times10^{-3}$ Torr in an Ar ambience mixed with 2%-5% $O_2$, and a temperature of the substrate is maintained at a room temperature.

With the method according to embodiments of the present disclosure, by using a non-selenylation process and forming the $In_2Se_3$ or ZnS buffer layer without cadmium, firstly, toxic gases such as $H_2Se$, $H_2S$ are not generated; secondly, a compound without cadmium is environmentally friendly and low cost; thirdly, a production equipment is simplified, an energy consumption is reduced and a production period is shortened.

Compared with a prior art, the method according to embodiments of the present disclosure has following advantages. All processes of the method are dry processes without using any chemical solvent or solution. The absorbing layer with a stable crystalline state is fabricated by one-step without additional selenylation or sulfurization process, thus greatly shortening the production period, reducing the production equipment, and preventing an environmental pollution as well as a potential danger during a production. In addition, the method has advantages of simple process, low energy consumption and low cost.

DESCRIPTION OF EMBODIMENTS

Various embodiments are described in detail below with reference to the drawings. Like reference numbers may be used to denote like parts throughout the figures.

Figure 1:
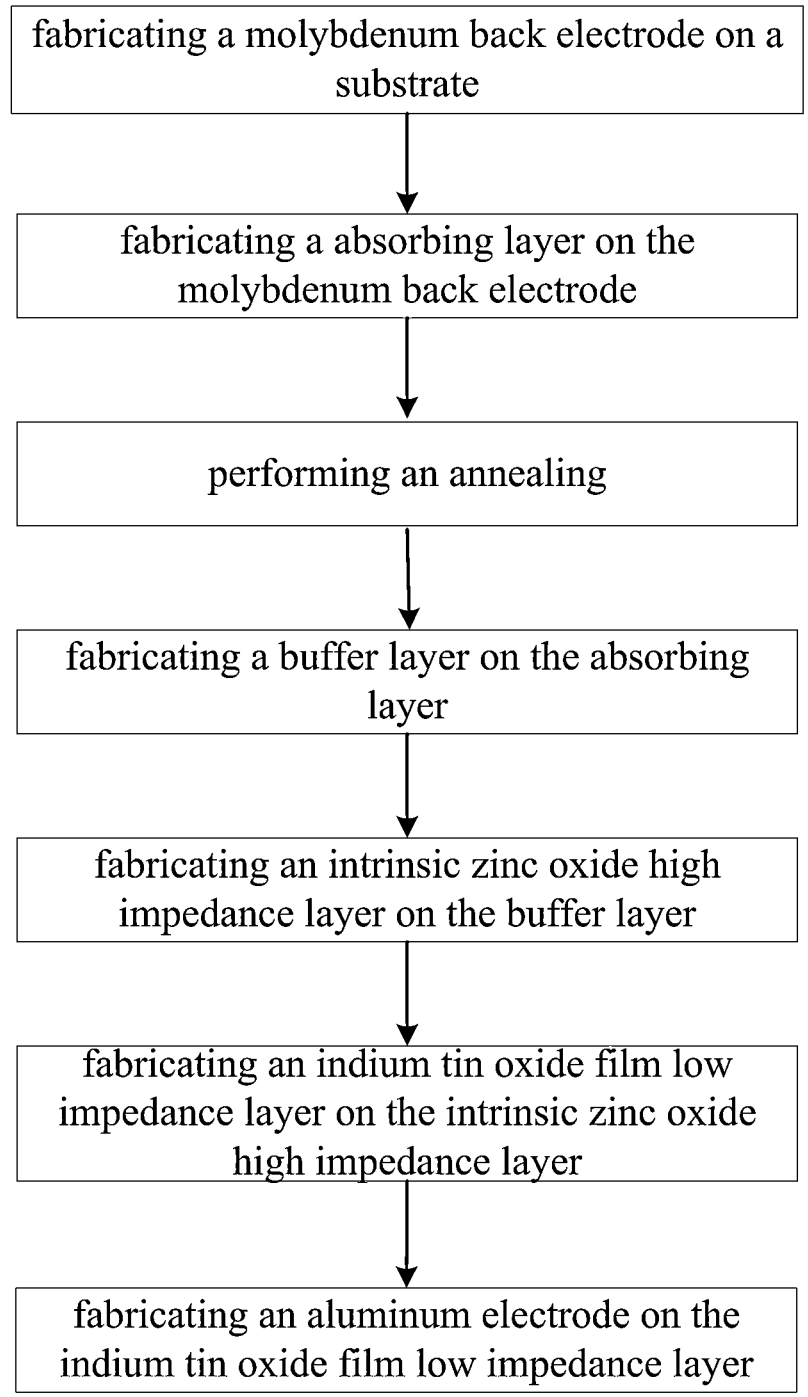
FIG. 1 is a flowchart illustrating a method for fabricating an absorbing layer of a Cu—In—Ga—Se film solar cell according to an embodiment of the present disclosure.

FIG. 1 is a flowchart illustrating a method for fabricating an absorbing layer of a Cu—In—Ga—Se film solar cell according to an embodiment of the present disclosure. As shown in FIG. 1, the method comprises following steps.

Firstly, a back electrode is fabricated on a substrate. The substrate may be a soda-lime glass substrate or a stainless steel sheet. Normally, the soda-lime glass substrate with a thickness of 1-3 mm or the stainless steel sheet with a thickness of 0.2 mm is preferred. In this embodiment, the back electrode is fabricated by depositing a molybdenum layer with a thickness of 0.8 μm using a magnetron sputtering.

Then, a Cu—In—Ga—Se absorbing layer is fabricated on the back electrode. In this embodiment, the absorbing layer is fabricated by a dual-target co-sputtering with $CuIn_xGa_{1-x}Se_2$ alloy targets. For a convenience purpose, suppose the $CuGaSe_2$ alloy target (where x=0) is called as target 1, and the $CuIn_xGa_{1-x}Se_2$ alloy target (where x ranges from 0.6 to 0.8) is called as target 2 (such as $Cu(In_{0.7}Ga_{0.3})Se_2$ target 2). Firstly, a sputtering with a high power density ranging from 4 W/cm$^2$ to 8 W/cm$^2$ is performed with the target 1 for 2-4 minutes, then a co-sputtering is performed with the target 1 and the target 2. During the co-sputtering process, the target 1 works with a power density continuously decreasing from any high power density ranging from 4 W/cm$^2$ to 8 W/cm$^2$ to any low power density ranging from 0.3 W/cm$^2$ to 1 W/cm$^2$, and the target 2 works with a power density continuously increasing from any initial low power density ranging from 0.3 W/cm$^2$ to 1 W/cm$^2$ to any high power density ranging from 4 W/cm$^2$ to 8 W/cm$^2$. In this means, it is ensured that a Ga concentration in the Cu—In—Ga—Se absorbing layer shows a gradient distribution. The Ga concentration has a maximum on a surface of the Cu—In—Ga—Se absorbing layer contacting with the molybdenum back electrode and has a minimum on the other surface of the Cu—In—Ga—Se absorbing layer. In one embodiment, the period for co-sputtering is 30-60 minutes, such that a thickness of the Cu—In—Ga—Se absorbing layer ranges from 1.5 μm to 2 μm. A working pressure of the sputtering chamber is $1\times10^{-4}$ Torr, and the temperature of the substrate is maintained at any temperature between 350° C. and 450° C.

Further, an annealing is performed for the Cu—In—Ga—Se absorbing layer in a rapid heating mode in a vacuum chamber under a temperature of 400-600° C. for 55-90 seconds. During the annealing process, it is not required to input any gas. After the annealing, the Cu—In—Ga—Se absorbing layer has a chalcopyrite structure, and a local ions diffusion occurs because of thermal energy, thus improving the crystalline state of the absorbing layer as well as the photovoltaic power generation efficiency of the primary absorbing layer of the solar cell.

Thereafter, an $In_2Se_3$ or ZnS buffer layer is fabricated on the absorbing layer by the vacuum magnetron sputtering with an $In_2Se_3$ alloy target or a ZnS alloy target under a working pressure of $1\text{-}5\times10^{-3}$ Torr in an Ar ambience, and a temperature of the substrate is maintained at a room temperature. A thickness of the $In_2Se_3$ or ZnS buffer layer ranges from 80 nm to 120 nm.

Then, an intrinsic zinc oxide high impedance layer is fabricated on the buffer layer by a radio frequency vacuum magnetron sputtering with an intrinsic zinc oxide (ZnO) target under a working pressure of $1\text{-}5\times10^{-3}$ Torr with a working frequency of 400K-2 MHz in an Ar ambience, and a temperature of the substrate is maintained at a room temperature. A thickness of the buffer layer ranges from 0.1 to 0.5 μm.

Further, an indium tin oxide ($In_2O_3$:$SnO_2$) film low impedance layer is fabricated on the intrinsic zinc oxide high impedance layer by a vacuum direct current magnetron sputtering with an indium tin oxide target, in which a mass ratio of $In_2O_3$ to $SnO_2$ is 9:1, under a working pressure of $1\text{-}5\times10^{-3}$ Torr in an Ar ambience mixed with 2%-5% $O_2$, and a temperature of the substrate is maintained at a room temperature. A thickness of the intrinsic zinc oxide low impedance layer ranges from 0.3 μm to 0.8 μm.

At last, an aluminum electrode is fabricated on the indium tin oxide film low impedance layer by a sputtering with an aluminum target. Finally, the Cu—In—Ga—Se film solar cell having a Ga concentration with gradient distribution is formed.

Figure 2:
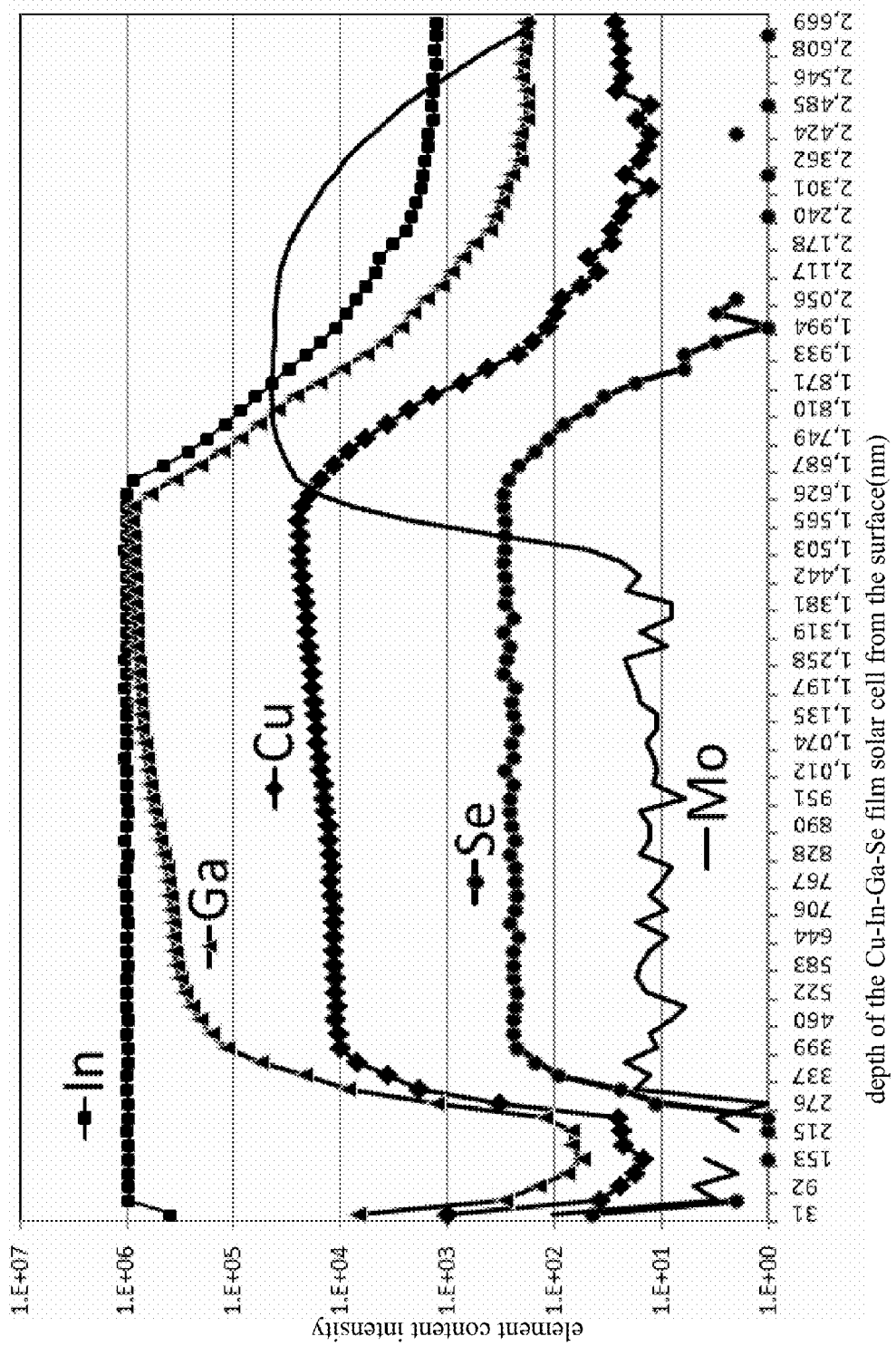
FIG. 2 is a secondary ion mass spectrum (SIMS) curve chart of the absorbing layer of the Cu—In—Ga—Se film solar cell fabricated by the method according to an embodiment of the present disclosure.

FIG. 2 is a secondary ion mass spectrum (SIMS) curve chart of the absorbing layer of the Cu—In—Ga—Se film solar cell fabricated according to the above method. It can be seen from FIG. 2 that the Ga concentration has a maximum on the surface of the Cu—In—Ga—Se absorbing layer contacting with the molybdenum back electrode and gradually decreases towards the other surface of the Cu—In—Ga—Se absorbing layer, which indicates that a bandgap of the absorbing layer has a gradient distribution.

Compared with a prior art, the method according to embodiments of the present disclosure has following advantages. All processes of the method are dry processes without using any chemical solvent or solution. The absorbing layer with a stable crystalline state is fabricated by one-step without additional selenylation or sulfurization process, thus greatly shortening a production period, reducing production equipment, and preventing an environmental pollution as well as a potential danger during a production. In addition, the method has advantages of simple process, low energy consumption and low cost.

All references cited in the description are hereby incorporated by reference in their entirety. While the disclosure has been described with respect to a limited number of embodiments, those skilled in the art, having benefit of this disclosure, will appreciate that other embodiments can be advised and achieved which do not depart from the scope of the description as disclosed herein.

What is claimed is:

1. A method for fabricating a Cu—In—Ga—Se film solar cell, comprising:
    a) fabricating a molybdenum back electrode on a substrate;
    b) fabricating a Cu—In—Ga—Se absorbing layer on the molybdenum back electrode by a vacuum magnetron sputtering with $CuIn_xGa_{1-x}Se_2$ alloy targets, wherein supposing the $CuGaSe_2$ alloy target where x=0 is a first target, and the $CuIn_xGa_{1-x}Se_2$ alloy target where x ranges from 0.6 to 0.8 is a second target, firstly a sputtering with any high power density ranging from 4 $W/cm^2$ to 8 $W/cm^2$ is performed with the first target for 2-4 minutes, then a co-sputtering is performed with the first target and the second target for 30-60 minutes, in which the first target works with a power density continuously decreasing from any high power density ranging from 4 $W/cm^2$ to 8 $W/cm^2$ to any low power density ranging from 0.3 $W/cm^2$ to 1 $W/cm^2$, and the second target works with a power density continuously increasing from any initial low power density ranging from 0.3 $W/cm^2$ to 1 $W/cm^2$ to any high power density ranging from 4 $W/cm^2$ to 8 $W/cm^2$, so that a Ga concentration in the Cu—In—Ga—Se absorbing layer has a gradient, the Ga concentration has a maximum on a surface of the Cu—In—Ga—Se absorbing layer contacting with the molybdenum back electrode and has a minimum on the other surface of the Cu—In—Ga—Se absorbing layer;
    c) performing an annealing for the Cu—In—Ga—Se absorbing layer in a rapid heating mode in a vacuum chamber under a temperature of 400-600° C. for 55-90 seconds;
    d) fabricating an $In_2Se_3$ or ZnS buffer layer with a thickness of 80-120 nm on the Cu—In—Ga—Se absorbing layer;
    e) fabricating an intrinsic zinc oxide high impedance layer with a thickness of 0.1-0.5 μm on the $In_2Se_3$ or ZnS buffer layer;
    f) fabricating an indium tin oxide film low impedance layer with a thickness of 0.3-0.8 μm on the intrinsic zinc oxide high impedance layer; and
    g) fabricating an aluminum electrode on the indium tin oxide film low impedance layer.

2. The method of claim 1, wherein a thickness of the Cu—In—Ga—Se absorbing layer ranges from 1.5 μm to 2 μm.

3. The method of claim 1, wherein in step b), a working pressure of a sputtering chamber is $1\times10^{-4}$ Torr, and a temperature of the substrate is maintained at any temperature between 350° C. and 450° C.

4. The method of claim 1, wherein in step d), the $In_2Se_3$ or ZnS buffer layer is fabricated by a vacuum magnetron sputtering with an $In_2Se_3$ alloy target or a ZnS alloy target under a working pressure of $1\text{-}5\times10^{-3}$ Torr in an Ar ambience, and a temperature of the substrate is maintained at a room temperature.

5. The method of claim 1, wherein in step e), the intrinsic zinc oxide high impedance layer is fabricated by a radio frequency vacuum magnetron sputtering with an intrinsic zinc oxide target under a working pressure of $1\text{-}5\times10^{-3}$ Torr with a working frequency of 400K-2 MHz in an Ar ambience, and a temperature of the substrate is maintained at a room temperature.

6. The method of claim 1, wherein in step f), the indium tin oxide film low impedance layer is fabricated by a vacuum direct current magnetron sputtering with an indium tin oxide target, in which a mass ratio of $In_2O_3$ to $SnO_2$ is 9:1, under a working pressure of $1\text{-}5\times10^{-3}$ Torr in an Ar ambience mixed with 2%-5% $O_2$, and a temperature of the substrate is maintained at a room temperature.

* * * * *